(12) United States Patent
Ibaraki (10) Patent No.: US 8,319,331 B2
(45) Date of Patent: Nov. 27, 2012

(54) SEMICONDUCTOR DEVICE

(75) Inventor: Souichirou Ibaraki, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 229 days.

(21) Appl. No.: 12/659,209

(22) Filed: Mar. 1, 2010

(65) Prior Publication Data

US 2010/0219525 A1 Sep. 2, 2010

(30) Foreign Application Priority Data

Mar. 2, 2009 (JP) ................................ 2009-047841

(51) Int. Cl.
*H01L 23/48* (2006.01)
(52) U.S. Cl. ................. 257/693; 257/E23.067
(58) Field of Classification Search ................. 257/693, 257/E23.067
See application file for complete search history.

(56) References Cited

U.S. PATENT DOCUMENTS

| 2006/0012033 A1* | 1/2006 | Noguchi | 257/712 |
| 2006/0128059 A1* | 6/2006 | Ahn et al. | 438/108 |
| 2007/0173052 A1* | 7/2007 | Ma | 438/614 |

FOREIGN PATENT DOCUMENTS

| JP | 2004-228485 A | 8/2004 |
| JP | 2006-032453 A | 2/2006 |

* cited by examiner

*Primary Examiner* — Kimberly Rizkallah
*Assistant Examiner* — Timor Karimy
(74) *Attorney, Agent, or Firm* — Rabin & Berdo, P.C.

(57) ABSTRACT

Disclosed is a semiconductor device having improved heat dissipation efficiency. The semiconductor device includes a silicon interposer having a first surface and a second surface opposite the first surface. A plurality of semiconductor chips are provided on the first surface side of the silicon interposer. The silicon interposer has a plurality of via holes extending from the first surface to the second surface. An N type semiconductor and a P type semiconductor constituting a Peltier element are provided in each two of the via holes.

17 Claims, 10 Drawing Sheets

SEMICONDUCTOR DEVICE

BACKGROUND OF THE INVENTION

1. Field of the Invention

The present invention relates to a structure of a semiconductor device having high packaging density. In particular, the present invention relates to a semiconductor device structure that can facilitate heat dissipation (heat release to the outside).

2. Description of the Related Art

One proposal for facilitating heat dissipation (heat radiation, heat release) from a single device in the field of semiconductor technology is disclosed in Japanese Patent Application Kokai (Publication) No 2006-032453. A Peltier element is incorporated in the device to cool the device (and release heat) from the device. With the downsizing and increasing functionality of equipment, on the other hand, various types of assembly are adopted. One example is a multi-chip package or MCP. One structure used for heat dissipation from the MCP is disclosed in Japanese Patent Application Kokai No. 2004-228485. A cooler chip including a Peltier element is disposed below a plurality of stacked integrated circuit (IC) chips.

A cooling principle (Peltier effect) using a Peltier element will be described in brief. Two different kinds of metals or semiconductors are electrically connected to each other in series. When electric current flows in the metals (or the semiconductors), endothermic and exothermic actions excluding Joule's heat occur at the connection between the metals (or the semiconductors). This phenomenon is called a Peltier effect. The Peltier element is a module using such a Peltier effect. An N type semiconductor and a P type semiconductor are connected in series to each other via a conductor, such as a metal. When predetermined electric current flows in the series-connected structure, endothermic and exothermic actions occur depending upon the flowing direction of the electric current. Thus, the Peltier element is a thermoelectric conversion element. For example, when electric current flows in a direction of a conductor A→an N type semiconductor→a conductor B→a P type semiconductor→a conductor C, then an endothermic phenomenon occurs in the conductor B, and an exothermic phenomenon occurs in the conductor A and the conductor C.

A silicon interposer (Si-IP) is used if a plurality of IC chips are mounted on a surface of a module (if a package does not include stacked IC chips). When the silicon interposer is used, it is possible to provide micro wiring. Accordingly, a module can have higher functionality and higher density. If the module has the silicon interposer, on the other hand, it is necessary to increase heat dissipation.

SUMMARY OF THE INVENTION

It is an object of the present invention to provide a semiconductor device having improved heat dissipation efficiency.

According to one aspect of the present invention, there is provided a semiconductor device that includes a silicon interposer having a first surface and a second surface. The semiconductor device also includes a plurality of semiconductor chips provided on the first surface side of the silicon interposer. The first surface is opposite the second surface. The silicon interposer has a plurality of via holes extending from the first surface to the second surface. The silicon interposer is provided on a mounting substrate. The second surface of the silicon interposer faces or is in contact with the mounting substrate. An N type semiconductor and a P type semiconductor constituting a Peltier element are formed in two of the via holes, respectively.

The N type semiconductor and the P type semiconductor extend through the silicon interposer (Si-IP). Therefore, the heat conduction distance from heat sources of the semiconductor chips on the silicon interposer to the mounting substrate is shortened. Because the heat conduction distance is shortened, thermal resistance is decreased. Accordingly, heat dissipation efficiency is improved.

It is preferable to provide heat conductive bodies below the silicon interposer such that heat conduction takes place in the conductive bodies. It is also preferable to provide interconnections (e.g., solder) between the conductive bodies and the mounting substrate such that the heat is transferred to the mounting substrate from the silicon interposer through the conductive bodies and the interconnections. The connecting members are another conductors. In this configuration, heat conduction occurs via the conductive bodies and the interconnections constituting the Peltier structure in a heat dissipation route of the module. Thus it is possible to maintain a high heat dissipation efficiency.

These and other objects, aspects and advantages of the present invention will become apparent to those skilled in the art from the following detailed description when read and understood in conjunction with the appended claims and drawings.

DETAILED DESCRIPTION OF THE INVENTION

Figure 1:
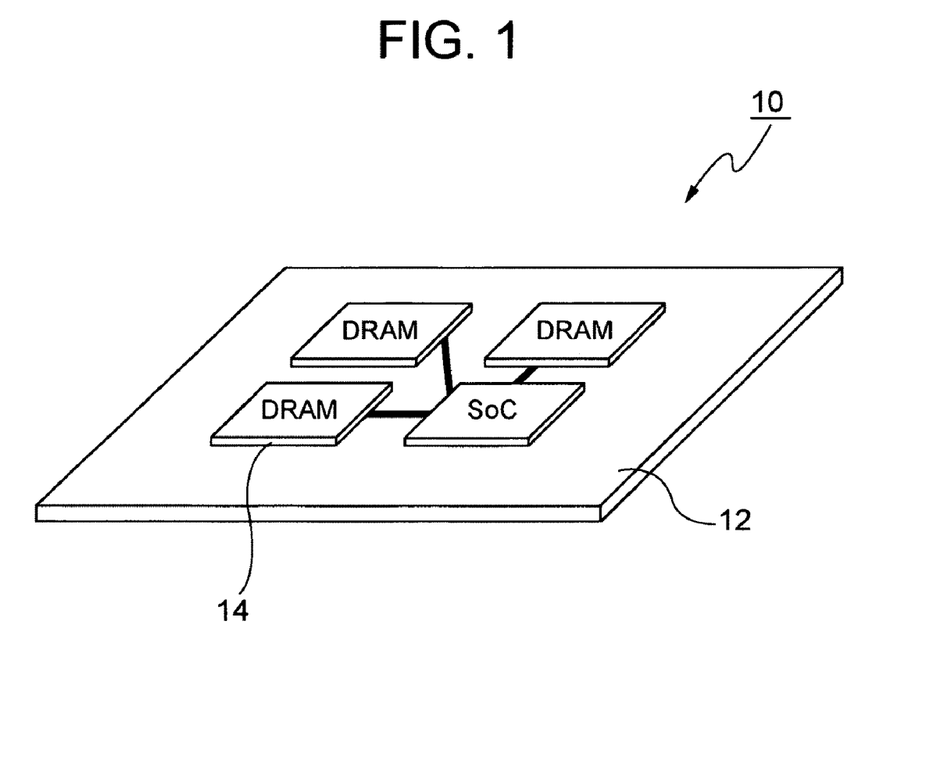
FIG. 1 is a perspective view of a semiconductor device to which the present invention is applicable.

Referring to FIG. 1, a general structure of a semiconductor device according to a preferred embodiment of the present invention is described. The semiconductor device 10 has four semiconductor chips 14 (i.e., three dynamic random access memories (DRAMs) and one system-on-a-chip (SoC)) on a silicon interposer 12. The present invention is particularly useful to such semiconductor 10 in which a plurality of semiconductor chips are loaded on a silicon interposer at the same level. Heat emission parts (integrated circuit forming surfaces) of the semiconductor device 10 may be covered with a conductor, such as a rewiring layer, to enhance an advantage of the present invention (efficient heat release).

First Embodiment

A first embodiment of the present invention will now be described with reference to FIG. 2 to FIG. 8. Referring to FIG.

Figure 2:
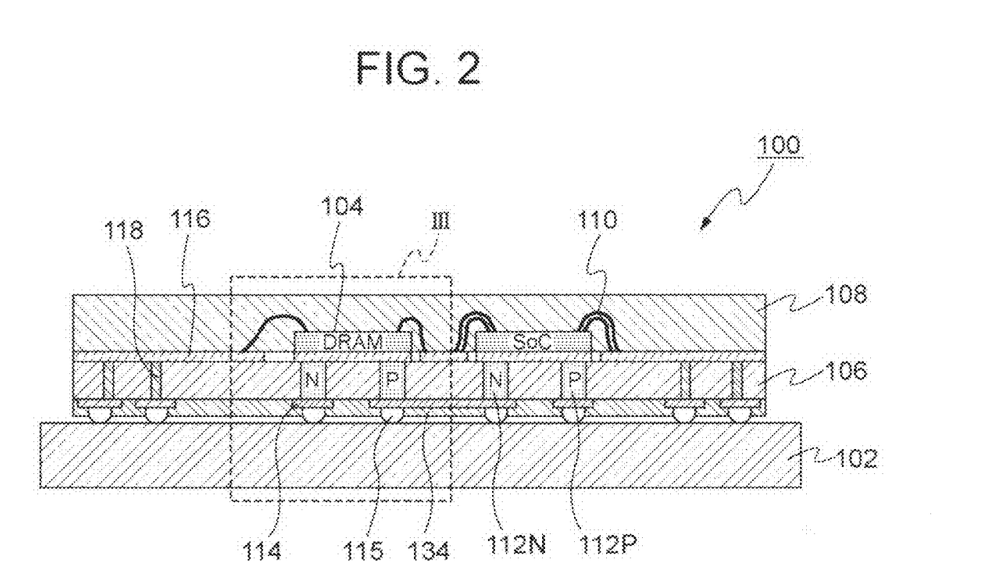
FIG. 2 is a cross-sectional view illustrating the structure of a semiconductor device according to a first embodiment of the present invention.

2 that illustrates a cross-sectional view of a semiconductor device 100 according to the first embodiment, the semiconductor device 100 includes a silicon interposer 106 loaded on a mounting substrate 102 and a plurality of semiconductor chips 104 loaded on the silicon interposer 106. The silicon interposer 106 has a plurality of via holes to receive N type semiconductors 112N and P type semiconductors 112P. A Peltier element is constituted by the N type semiconductors 112N and the P type semiconductors 112P.

As shown in FIG. 2, a plurality of via electrodes 118 are formed in the silicon interposer 106. The via electrodes 118 are electrically connected to the mounting substrate 102 via aluminum pads 114 and external terminals (solders) 115. The N type semiconductor 112N and the P type semiconductor 112P extend through the silicon interposer 106 in the thickness direction of the silicon interposer 106. The N type semiconductor 112N and the P type semiconductor 112P are also electrically connected to the mounting substrate 102 via the aluminum pads 114 and external terminals (solders) 115. It should be noted that antimony telluride (Sb2Te3) may be used as the material of the N type semiconductor 112N, and bismuth telluride (Bi2Te3) may be used as the material of the P type semiconductor 112P. The N type semiconductor 112N and the P type semiconductor 112P may be formed using a sputtering method or a deposition method. The holes for the semiconductors 112N and 112P may be filled with suitable materials (fillers) using a squeezing method, and the fillers may be sintered (baked) using a sintering method, to form the N type semiconductor 112N and the P type semiconductor 112P.

A rewiring layer, i.e., a first conductor layer 116, is formed on the upper surface of the silicon interposer 106 (the side of the silicon interposer 106 opposite the mounting substrate 102). The semiconductor chips 104 are loaded on the first conductor layer 116, and the semiconductor chips 104 are electrically connected to the wiring layer by bonding wires 110. The semiconductor chips 104 are covered with an encapsulation resin (sealing resin) 108.

In FIG. 2, an electric current flows in a direction from the external electrode 115→the N type semiconductor 112N→the first conductor layer 116→the P type semiconductor 112P→the second conductor layer 134→the N type semiconductor 112N→the first conductor layer 116→the P type semiconductor 112P→the external electrode 115, which form a closed circuit with an external power supply.

On the other hand, a heat flow route (a cooling route) is as follows. Heat generated from each integrated circuit 104 reaches the first conductor layer 116, and to both the P type semiconductor 112P and the N type semiconductor 112N. After that, the heat is conducted to the second conductor layers 134, and a heat dissipation phenomenon occurs in the second conductor layer 134. The heat dissipated from the second conductor layers 134 is mostly conducted to the mounting substrate 102 via the external electrodes 115.

Figure 3:
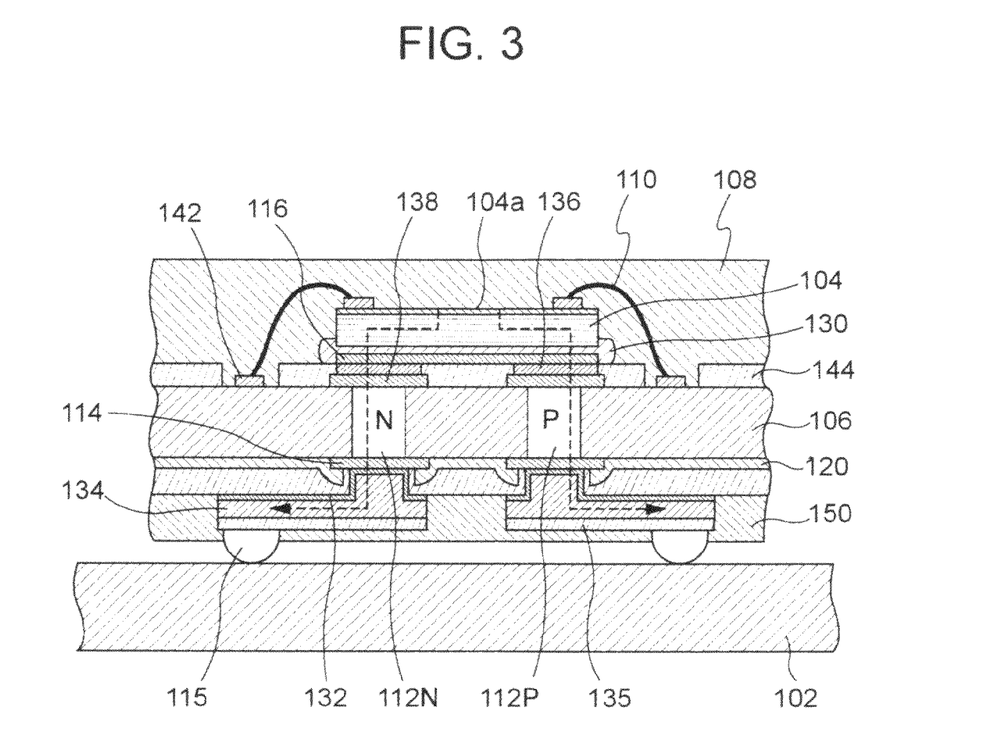
FIG. 3 is an enlarged cross-sectional view illustrating the structure of a portion (a part encircled by the dashed line III) of the semiconductor device shown in FIG. 2.
Figure 4:
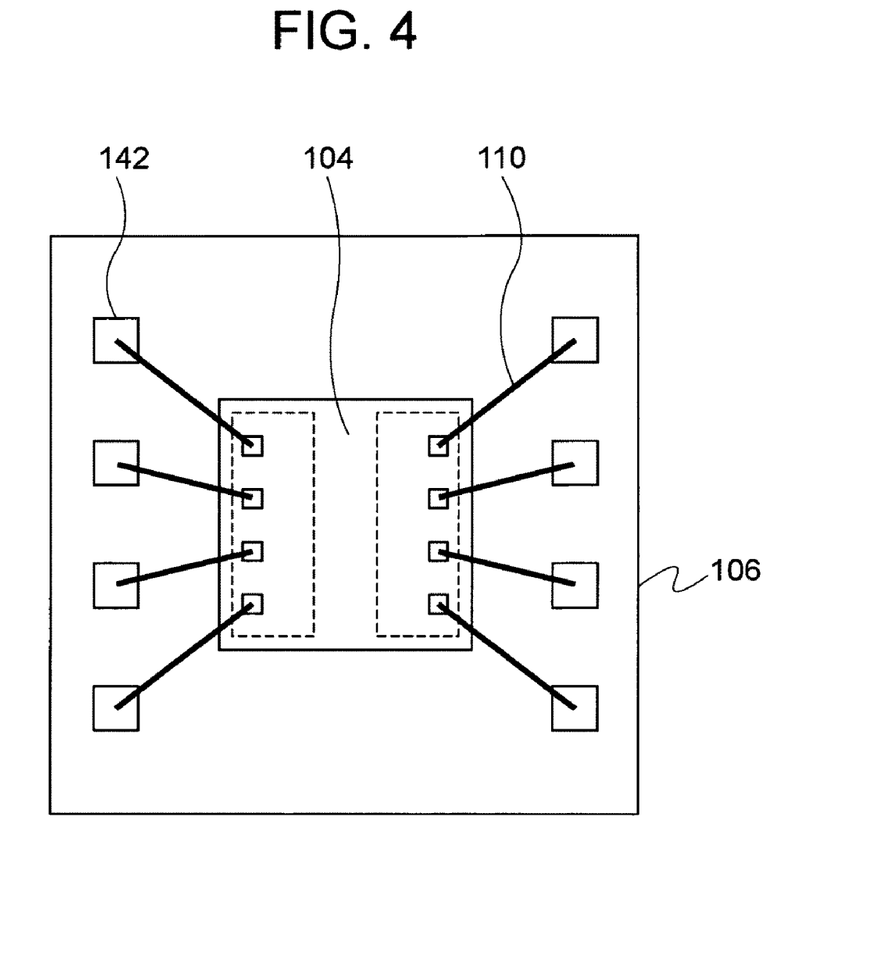
FIG. 4 is a schematic top view of FIG. 3.
Figure 5:
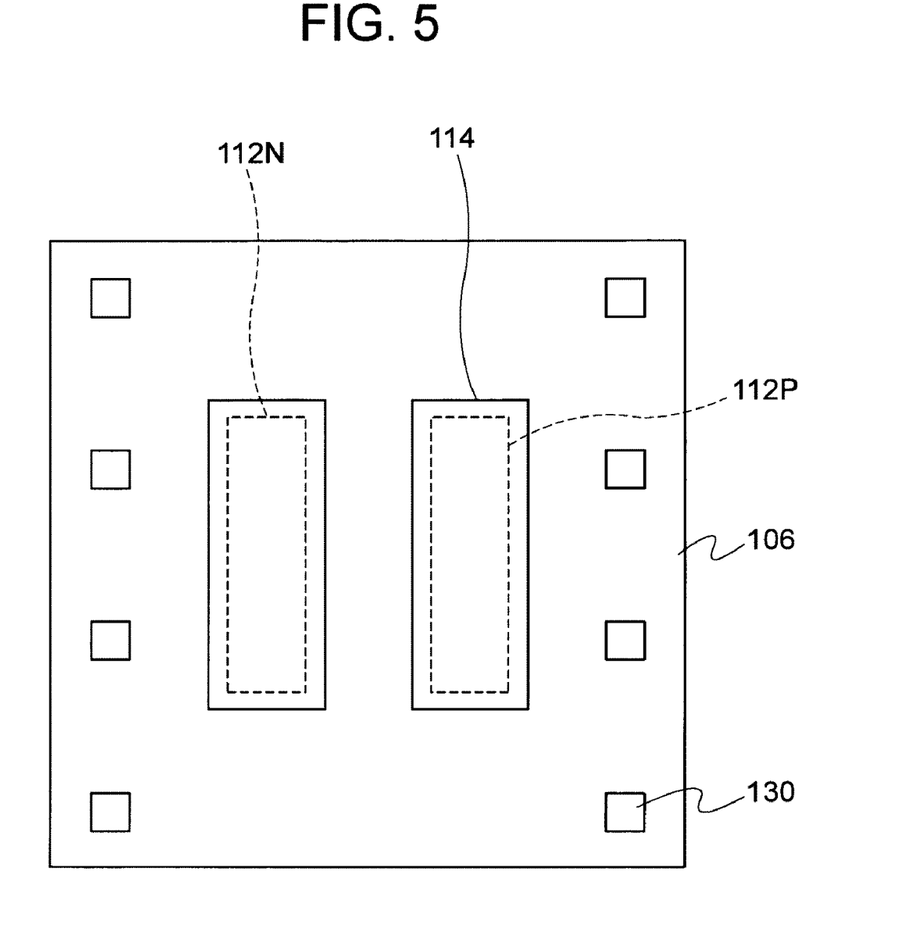
FIG. 5 is a schematic bottom view of FIG. 3.

A portion III of the structure of FIG. 2 is shown in detail in FIG. 3. Referring to FIG. 3, a second conductor 134, functioning as a heat dissipation part of the Peltier element, is formed between each external terminal 115 and the silicon interposer 106. A barrier metal 132 is formed between the second conductor 134 and a corresponding aluminum pad 114. The lower surface of the silicon interposer 106 is covered with a protective film 120. If solders are used as the external electrodes 115, a solder resist may be applied in order to prevent so-called solder run out. A UBM (Ni—Au layer) film 135 is formed between each second conductor layer 134 and the associated external electrode 115.

As illustrated in FIG. 3, a conductor (aluminum) pad 138 covered with a protective film (nitride film) 144 is provided between the N type semiconductor 112N buried in the silicon interposer 106 and the first conductor layer 116. Another conductive film 138 covered with the film 144 is provided between the P type semiconductor 112P and the first conductor layer 116. Each semiconductor chip 104 is connected to the first conductor layer 116 by a thermal interface material 130. Bonding pads 142, to which ends of the bonding wires 110 are connected, are formed at the upper surface of the silicon interposer 106. Reference numeral 104a designates an integrated circuit forming surface (heat source) of each semiconductor chip, and reference 150 designates a resist resin.

The structure according to this embodiment is particularly useful in a case in which a wafer level chip size package (W-CSP) is not achieved due to restrictions, such as numerous pins and narrow pin pitch, of components. In this embodiment, wiring for power supply and signal transmission related to the operation of each semiconductor chip 104 is disposed on the silicon interposer 106 such that the wiring is separated from the power supply to the Peltier element. As is well known in the art, a direct current power supply is used to operate the Peltier element.

In FIG. 3, an electric current flows in a direction from the external electrode 115→the second conductor layer 134→the N type semiconductor 112N→the first conductor layer 116→the P type semiconductor 112P→the second conductor layer 134→the external electrode 115, which form a closed circuit with an external power supply.

A heat flow route (a cooling route) is as follows. Heat generated from each integrated circuit 104 reaches the first conductor layer 116, and both the P type semiconductor 112P and the N type semiconductor 112N via the thermal grease 130. After that, the heat is conducted to the second conductor layers 134. In the layers 134, a heat dissipation phenomenon occurs. The two arrows in the drawing indicate the heat flow. The heat dissipated from the second conductor layers 134 is mostly conducted to the mounting substrate 102 via the external electrodes 115.

According to the above-described embodiment of the present invention, it is not necessary to provide columnar electrodes. In addition, the semiconductor chips 104 are connected to the mounting substrate 102 via the smallest (shortest) distance using the silicon interposer 106. Therefore, high heat dissipation efficiency is achieved. The P type and N type semiconductors are formed in the via holes formed in the silicon interposer 106, and the electrodes are provided at the opposite ends of the silicon interposer 106 (Si-IP containing the Peltier element). Consequently, it is possible to control heat conduction in the vertical direction. Here, "control of heat conduction" includes measuring and monitoring of the temperature of each semiconductor chip 104 using a temperature sensor and controlling of a voltage applied to the Peltier element using an associated control circuit based on the result of the measuring and monitoring. For example, when the temperature of each semiconductor chip 104 is high, the voltage applied to the Peltier element is increased to enhance the cooling. On the other hand, when the temperature of each semiconductor chip 104 is low, the voltage applied to the Peltier element is decreased in order not to cause the temperature of each semiconductor chip 104 to drop excessively.

Figure 6A:
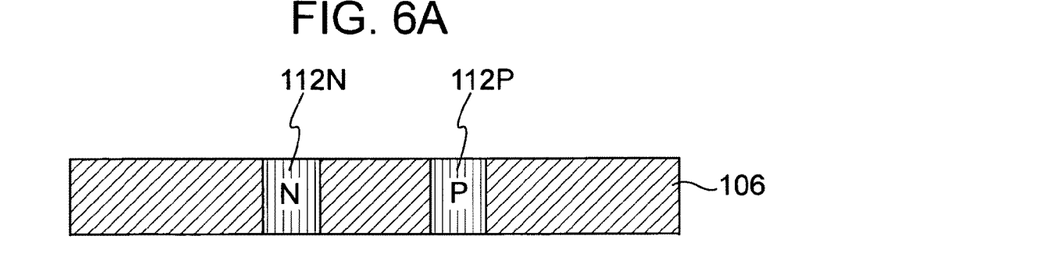
FIGS. 6A to 6D, 7E to 7F and 8G to 8H are a series of cross-sectional views that illustrate a process of manufacturing a semiconductor device shown in FIG. 2 (or FIG. 3)

FIGS. 6A to 6D, FIGS. 7E and 7F, and FIGS. 8G and 8H are a series of cross-sectional views illustrating a process of manufacturing the semiconductor device shown in FIG. 3. First, via holes are formed in a silicon wafer 106 by a photolithography process, a dry etching process or a wet etching process. Subsequently, metal powder is injection molded in the via holes using a mold. At this time, the metal powder may be mixed with a binder. Subsequently, an N type semiconductor 112N and a P type semiconductor 112P are formed in the via holes by sintering. After that, the surfaces of the N type semiconductor 112N and the P type semiconductor 112P are flattened such that the N type semiconductor 112N and the P type semiconductor 112P have a predetermined thickness, as shown in FIG. 6A.

Figure 6B:
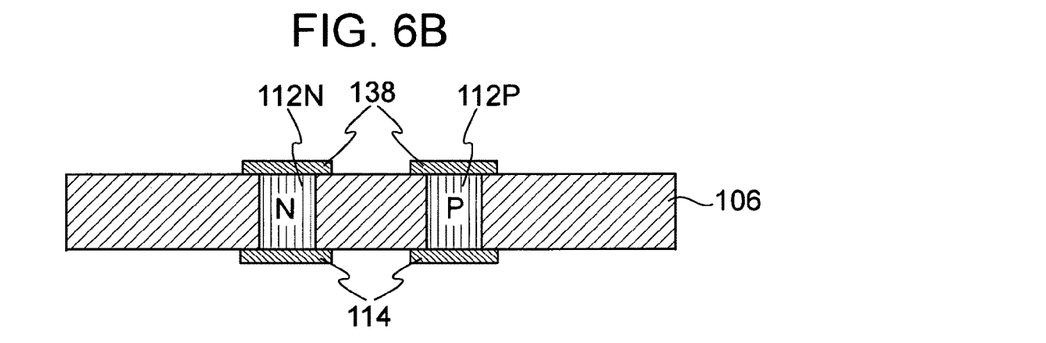

A multi-layer film (TiN/Al/TiN), having a thickness of 1 to 2 um (micrometer), consisting of a titanium nitride layer, an aluminum layer, and a titanium nitride layer, is formed on the silicon interposer 106 using a sputtering method. After that, as shown in FIG. 6B, aluminum pads 114 and 138 are formed at opposite ends of the P type semiconductor 112P and the N type semiconductor 112N using a photolithography method and an etching method.

Figure 6C:
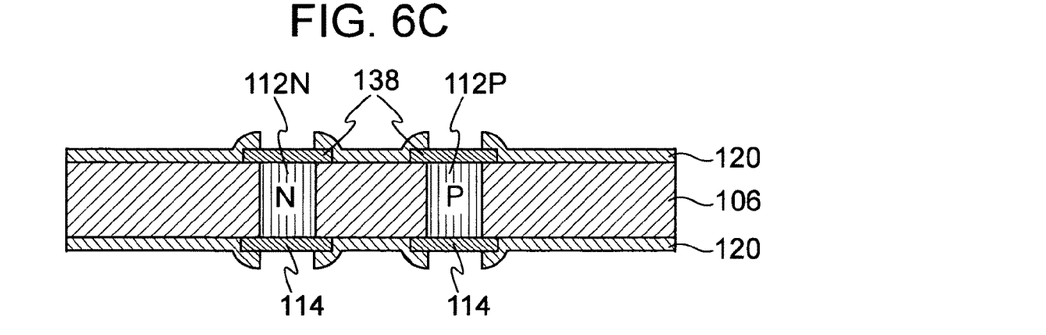

Protective films (SiN) 120 each having a thickness of 1 to 2 um are formed on the upper and lower surfaces of the silicon interposer 106 using a plasma chemical vapor deposition (CVD) method. After that, as shown in FIG. 6C, the aluminum pads 114 and 138 are partly exposed using a photolithography method and an etching method.

Figure 6D:
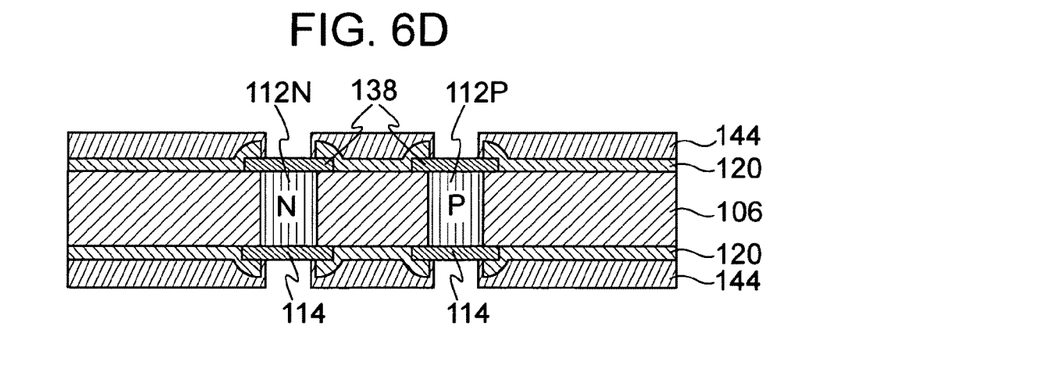

Insulation films (polyimide) 144 each having a thickness of 4 to 5 um are formed on the upper and lower protective films (SiN) 120 using a spin coating method. After that, as shown in FIG. 6D, the aluminum pads 114 and 138 are partly exposed using a photolithography method and an etching method.

Figure 7E:
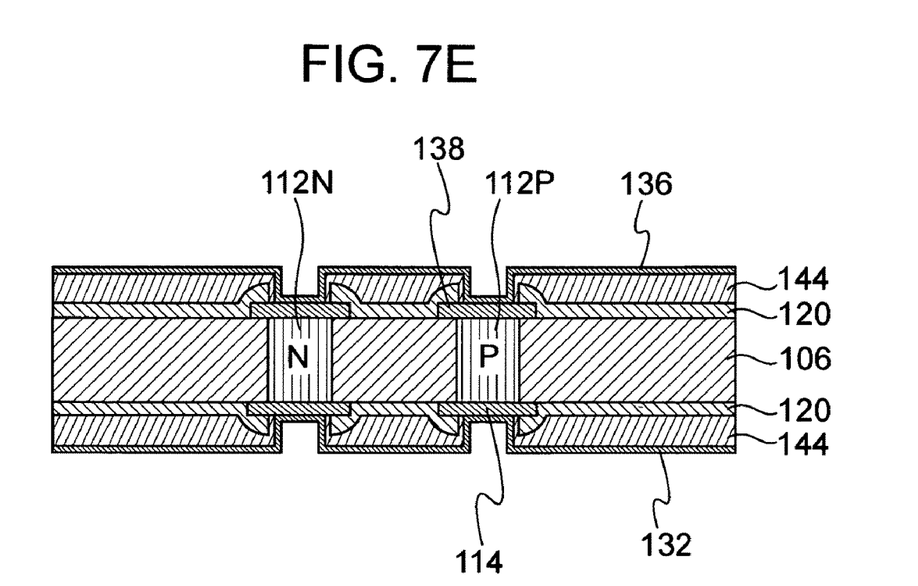

As shown in FIG. 7E, barrier metal layers 132 and 136 (Ti and Cu sequentially disposed from the silicon interposer 106 side) are formed on the lower and upper insulation films 144 using a sputtering method such that the barrier metal layers 132 and 136 are connected to the aluminum pads 114 and 138, respectively. Here, the Ti layer and the Cu layer have a thickness of approximately 0.4 to 0.5 um.

Figure 7F:
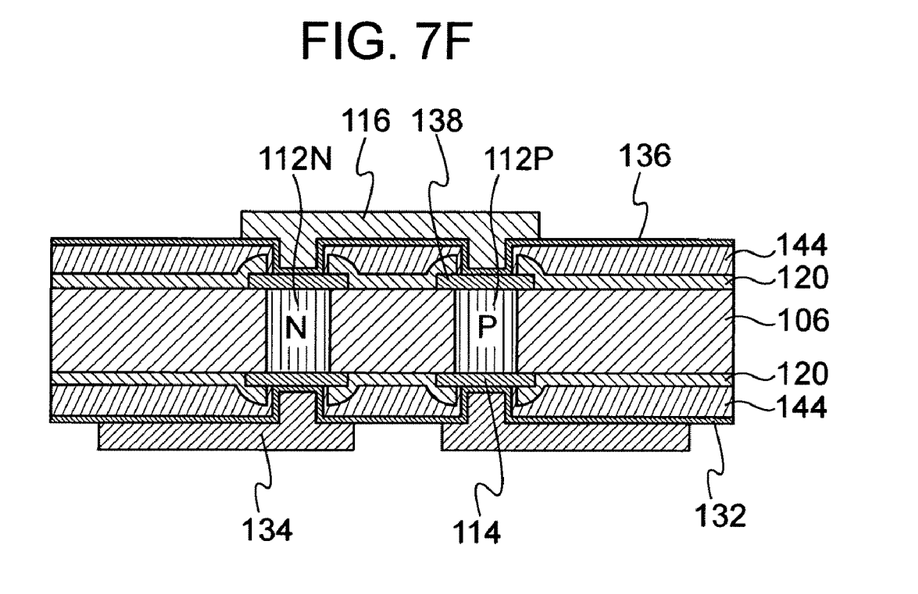

Subsequently, resist films (not shown) patterned using a photolithography method are formed on the respective barrier metals. After that, as shown in FIG. 7F, conductor layers (Cu) 116 and 134 each having a thickness of 4 to 5 um are formed on the resist films using an electroplating method such that the P type semiconductor 112P and the N type semiconductor 112N are electrically connected to each other by the conductor layers 116 and 134.

Figure 8G:
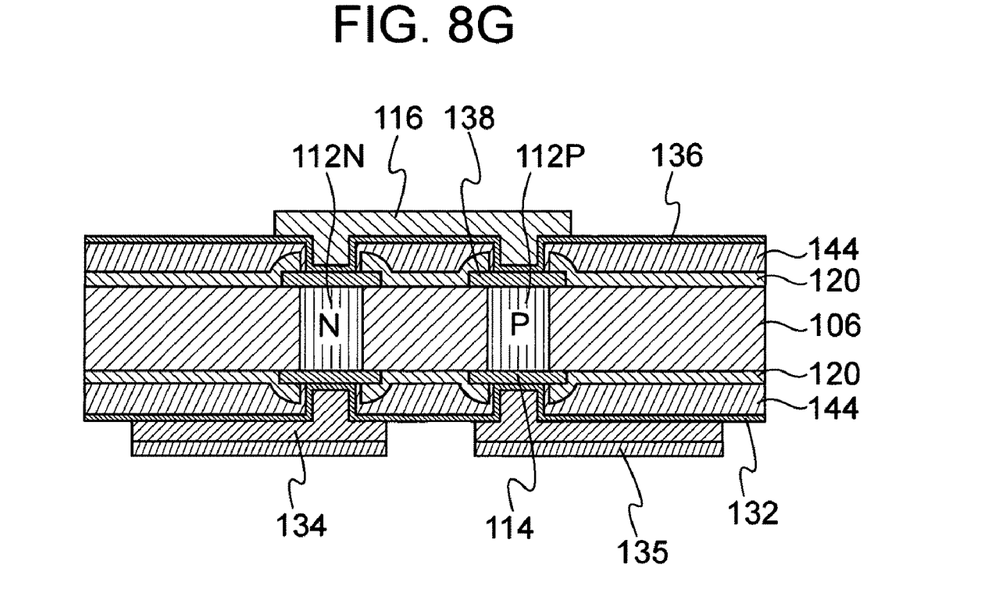

After the first conductor layer 116 is formed, as shown in FIG. 8G, under bump metal (UBM) films 135 are formed on the second conductor layers 134 using an electroplating method without removal of the resist. Each of the UBM films 135 may be formed of Ni and/or Au, and have a thickness of 5 to 7 um.

Figure 8H:
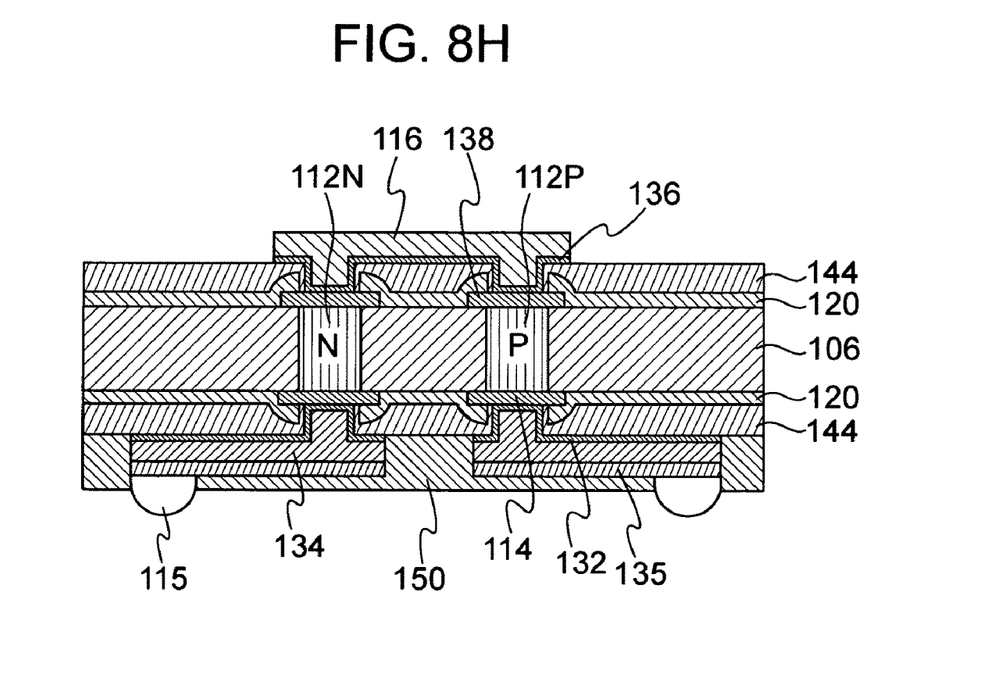

Then, the resist is removed. As shown in FIG. 8H, the barrier metals 132 and 136 are partially removed using an etching method. Subsequently, a solder resist 150 is formed on the lower insulation film 144 and the second conductive layer 134 using a screen printing method such that those parts of the UBM films 135 that correspond to external terminals 115 (external terminal forming parts) are exposed. After that, external terminals 115 are formed on the exposed portions of the UBM films 135 using a screen printing method and a reflow method. For example, each of the external terminals (solders) 115 has a height of approximately 100 um for LGA (Land Grid Array) or approximately 300 um for BGA (Ball Grid Array) when the pitch is 0.5 mm.

Second Embodiment

Figure 9:
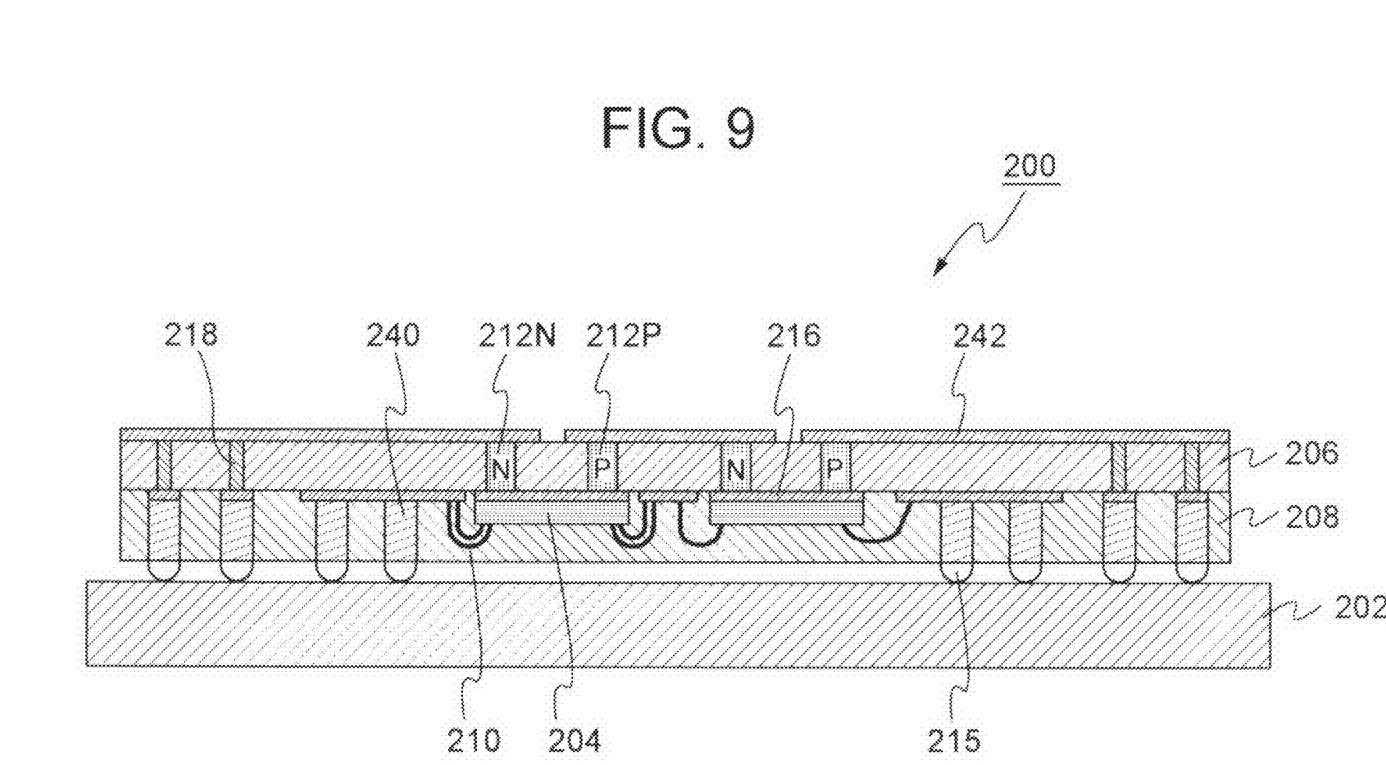
FIG. 9 is a cross-sectional view of the structure of a semiconductor device according to a second embodiment of the present invention.

FIG. 9 is a cross-sectional view illustrating the structure of a semiconductor device 200 according to a second embodiment of the present invention. The structure according to this embodiment is particularly useful in a case in which W-CSP is not achieved due to restrictions, such as numerous pins and narrow pin pitch, of components.

In this embodiment, the semiconductor device 200 includes a silicon interposer 206 loaded on a mounting substrate 202 and a plurality of semiconductor chips 204 loaded on the silicon interposer 206. The silicon interposer 206 has a plurality of via holes in which an N type semiconductor 212N and a P type semiconductor 212P are provided (filled). A Peltier element is constituted by the N type semiconductor 212N and the P type semiconductor 212P.

As shown in FIG. 9, a plurality of via electrodes 218 are formed in the silicon interposer 206. The via electrodes 218 are connected to a second conductor layer 242 exhibiting a heat dissipation effect. The N type semiconductor 212N and the P type semiconductor 212P extend through the silicon interposer 206 in the thickness direction of the silicon interposer 206. A first conductor layer 216 and the second conductor layer 242 are connected to opposite ends of the N type semiconductor 212N and the P type semiconductor 212P.

Antimony telluride (Sb2Te3) may be used as the material of the N type semiconductor 212N, and bismuth telluride (Bi2Te3) may be used as the material of the P type semiconductor 212P. The N type semiconductor 212N and the P type semiconductor 212P may be formed using a sputtering method or a deposition method. Holes in the interposer 206 may be filled with suitable materials (fillers) using a squeezing method, and the fillers may be sintered (baked) using a sintering method, to form the N type semiconductor 212N and the P type semiconductor 212P.

In the second embodiment, wiring for a power supply and signal transmission related to the operation of each semiconductor chip 204 are connected to the silicon interposer 206 by wire bonding such that the wiring is separated from the power supply of the Peltier element. The conductor layer (endothermic part, first conductor layer) 216 is connected to the N type semiconductor 212N and the P type semiconductor 212P by an adhesive exhibiting high heat conductivity. A plurality of columnar electrodes (post electrodes) 240 are provided on the lower surface of the silicon interposer 206 and are encapsulated by a resin 208. As is well known, a direct current power supply is used to operate the Peltier element. The columnar electrodes 240 are connected to the mounting substrate 202 via solders (external terminals) 215.

The semiconductor chips 204 are electrically connected to the wiring layer 216 by bonding wires 210. The semiconductor chips 204 are covered with an encapsulation resin 208.

In FIG. 9, electric current flows from the external electrode 215→the columnar electrode 240→the via electrode 218→the second conductor layer 242→the N type semiconductor 212N→the first conductor layer 216→the P type semiconductor 212P→the second conductor layer 242→the via electrode 218→the columnar electrode 240→the external electrode 215, which form a closed circuit with an external power supply.

On the other hand, a heat flows as follows (a cooling route). Heat generated from each integrated circuit 204 reaches the first conductor layer 216, the P type semiconductor 212P and the N type semiconductor 212N. After that, the heat is conducted to the second conductor layer 242, in which a heat dissipation phenomenon occurs. The heat is transferred from the second conductor layer 242 to external air on one hand. On the other hand or at the same time, the heat is conducted to the mounting substrate 202 through the via electrodes 218, the columnar electrodes 240, and the external terminals 215.

According to the second embodiment, the exposed area of the conductor layer contributing to the heat dissipation becomes larger than the first embodiment, thereby further improving heat dissipation efficiency. In this embodiment, it is possible to manufacture the silicon interposer 206 using the same method (FIGS. 7E and 7F) as in the first embodiment. It should be noted that in FIG. 9, heat sinks may be provided at the non chip mounting side (upper surface) of the silicon interposer 206 to improve heat dissipation efficiency.

Third Embodiment

Figure 10:
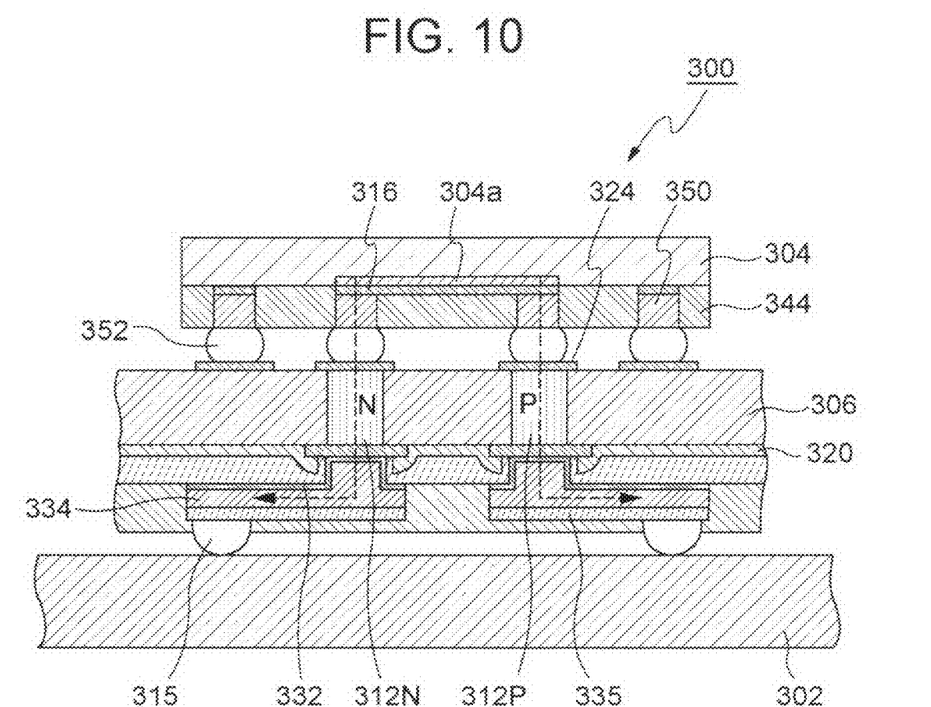
FIG. 10 is a cross-sectional view of the structure of a semiconductor device according to a third embodiment of the present invention.

FIG. 10 is a cross-sectional view illustrating the structure of a semiconductor device according to a third embodiment of the present invention. FIG. 10 is an enlarged cross-sectional view similar to FIG. 3. Therefore, it should be understood that a plurality of semiconductor chips 304 are in fact provided on a silicon interposer 306, as shown in FIGS. 2 and 9.

The third embodiment is characterized by a heat source (integrated circuit forming surface) 304a of each semiconductor chip that is covered with a first conductor layer 316. Columnar electrodes 350 on the first conductor layer 316 are connected to an N type semiconductor 312N and a P type semiconductor 312P via external electrodes 352.

In this embodiment, wiring for power supply and signal transmission related to the operation of each semiconductor chip 304 is disposed on the silicon interposer 306 such that the wiring is separated from the power supply for the Peltier element. As is well known, a direct current power supply is used to operate the Peltier element.

As shown in FIG. 10, the N type semiconductor 312N and the P type semiconductor 312P extend through the silicon interposer 306 in the thickness direction of the silicon interposer 306. Aluminum pads 324 and the external electrodes 352 are provided at upper ends of the N type semiconductor 312N and the P type semiconductor 312P. The columnar electrodes 350 are located on the external electrodes 352, and the first conductor layer 316 is provided on upper ends of the columnar electrodes 350. The first conductor layer 316 spans the columnar electrodes 350. Second conductor layers 334 are formed below the N type semiconductor 312N and the P type semiconductor 312P. The second conductor layers 334 and a barrier metal 332 are covered with a solder resist excluding the areas for the external electrodes 315.

Like the first and second embodiments, antimony telluride (Sb2Te3) may be used as the material for the N type semiconductor 312N, and bismuth telluride (Bi2Te3) may be used as the material for the P type semiconductor 312P in the third embodiment. The N type semiconductor 312N and the P type semiconductor 312P may be formed using a sputtering method or a deposition method. Holes for the semiconductors 312N and 312P may be filled with a suitable material (fillers) using a squeezing method, and the fillers may be sintered (baked) using a sintering method, to form the N type semiconductor 312N and the P type semiconductor 312P.

Each second conductor layer 334 is connected to the mounting substrate 302 via a UBM (Ni—Au layer) film 335 and the corresponding external electrode 315. As described above, the first conductor layer 316 is formed (coated) on the heat source (integrated circuit forming surface) 304a of each semiconductor chip 304. The columnar electrodes 350 extend from the first conductor layer 316. The columnar electrodes 350 are connected to the N type semiconductor 312N and the P type semiconductor 312P via the external electrodes 352. The aluminum pads 324 of the silicon interposer 306 are connected to the columnar electrodes 350 via the external electrodes 352. The columnar electrodes 350 are covered with an encapsulation resin 344.

In FIG. 10, an electric current flows in a direction from the external electrode 315→the second conductor layer 334→the N type semiconductor 312N→the first conductor layer 316→the P type semiconductor 312P→the second conductor layer 334→the external electrode 315, which form a closed circuit with an external power supply.

On the other hand, a heat flow route (a cooling route) is as follows. Heat generated from each integrated circuit 304 is conducted to the second conductor layers 334 via the first conductor layer 316, the P type semiconductor 312P and the N type semiconductor 312N, as indicated by the two arrows in the drawing. A heat dissipation phenomenon occurs in the second conductor layers 334. The heat is mostly dissipated from the second conductor layers 334 to the mounting substrate 302 mainly through the external electrodes 315.

According to the third embodiment, the first conductor layer 316, which covers the heat source (integrated circuit forming surface) 304a of each semiconductor chip 304, the Peltier element including the N type semiconductor 312N and the P type semiconductor 312P, and the wiring for the direct current power supply of the mounting substrate 302 form a closed circuit, thereby achieving effective heat dissipation based on a Peltier effect. A rewiring layer (not shown) rewiring the integrated circuit forming surface 304a of each semiconductor chip 304 and the first conductor layer 316 of the Peltier element structure may be formed at the same level by the same process. However, no electric connection is established between the rewiring layer and the first conductor layer 316.

Although the exemplary embodiments of the present invention are described above, the present invention is not limited to the above-described embodiments. Various changes and/or modification may be made to the illustrated embodiments without departing from the spirit and scope of the present invention. The spirit and scope of the present invention should be defined by the claims.

This application is based on Japanese Patent Application No. 2009-47841 filed on Mar. 2, 2009 and the entire disclosure thereof is incorporated herein by reference.

What is claimed is:

1. A semiconductor device comprising:
a silicon interposer having a first surface and a second surface opposite the first surface;
a plurality of semiconductor chips provided on a side of the silicon interposer that includes the first surface,
the silicon interposer having a plurality of pairs of via holes extending from the first surface to the second surface, and each pair of the via holes being associated with one of said semiconductor chips, and
an N type semiconductor, and
a P type semiconductor,
wherein for each pair of via holes, one of the pair of via holes has the N type semiconductor disposed therewithin and a second of the pair of via holes has the P type semiconductor disposed therewithin so as to form a Peltier element.

2. The semiconductor device according to claim 1 further comprising:
first conductor layers, each being disposed between each of the semiconductor chips and the N and P type semiconductors; and
external electrodes provided on a side of the silicon interposer that includes the second surface such that the external electrodes are electrically connected to the N type semiconductor and the P type semiconductor.

3. The semiconductor device according to claim 2 further comprising second conductor layers provided between the N type semiconductor and corresponding ones of the external electrodes and between the P type semiconductor and corresponding ones of the external electrodes.

4. The semiconductor device according to claim 3 further comprising an Ni—Au layer between the second conductor layers and the external electrodes.

5. The semiconductor device according to claim 3, further comprising a solder resist that covers the second conductor layers so that the second conductor layers are not exposed therefrom, the solder resist further covering a portion of each of the external electrodes so that each external electrode is exposed therefrom.

6. The semiconductor device according to claim 2, further wherein the first conductor layers include rewiring layers, wherein each of the semiconductor chips has a heat emission part covered with one of the rewiring layers causing an endothermic action, and each of the rewiring layers is electrically connected to the N type semiconductor and the P type semiconductor.

7. The semiconductor device according to claim 6, wherein the Peltier elements cool heat from a heat source of the semiconductor chips that includes integrated circuits.

8. The semiconductor device according to claim 2, wherein each of the semiconductor chips has a heat emission part covered with an associated one of the first conductor layers.

9. The semiconductor device according to claim 8, wherein the Peltier elements cool heat from a heat source of the semiconductor chips that includes integrated circuits.

10. The semiconductor device according to claim 2, wherein the external electrodes are partly exposed to the outside.

11. The semiconductor device according to claim 2, wherein the external electrodes are connected to a mounting substrate.

12. The semiconductor device according to claim 2, wherein a heat source part of the semiconductor chips is not in contact with the first conductor layers.

13. The semiconductor device according to claim 1 further comprising:
   a mounting substrate;
   an encapsulation resin for encapsulating the semiconductor chips;
   first conductor layers, each being provided between each of the semiconductor chips and the P and N semiconductors;
   via electrodes provided in the encapsulation resin and electrically connected to the first conductor layers, the via electrodes further being electrically connected to the mounting substrate via the external electrodes; and
   second conductor layers provided on the side of the silicon interposer that includes the second surface such that the second conductor layers are exposed to the outside.

14. The semiconductor device according to claim 13 further comprising a plurality of heat sinks on the second surface of the silicon interposer.

15. The semiconductor device according to claim 1, wherein wiring for the semiconductor chips is separated from wiring for the Peltier elements.

16. The semiconductor device according to claim 1, wherein each of the first surface and the second surface is completely covered so as to be unexposed to air.

17. The semiconductor device according to claim 1, further comprising:
   a first protective film touching the first surface;
   a second protective film touching the second surface; and
   a sealing resin touching the second surface.

* * * * *